United States Patent [19]
Kadomura

[11] Patent Number: 5,397,431
[45] Date of Patent: Mar. 14, 1995

[54] DRY ETCHING METHOD

[75] Inventor: Shingo Kadomura, Kanagawa, Japan

[73] Assignee: Sony Corporation, Tokyo, Japan

[21] Appl. No.: 94,892

[22] Filed: Jul. 22, 1993

[30] Foreign Application Priority Data

Jul. 24, 1992 [JP] Japan ................ 4-198736

[51] Int. Cl.$^6$ ........................................ H01L 21/00
[52] U.S. Cl. ................ 156/662; 156/643; 156/646; 156/659.1; 156/657; 156/651; 156/653
[58] Field of Search ............... 156/643, 646, 662, 656, 156/657, 655, 659.1, 661.1, 651, 653

[56] References Cited

U.S. PATENT DOCUMENTS

| | | |
|---|---|---|
| 4,465,552 | 8/1984 | Boffio et al. ............... 156/643 |
| 4,579,623 | 4/1986 | Suzuki et al. ............. 156/643 |
| 4,992,136 | 2/1991 | Tachi et al. .............. 156/643 |

FOREIGN PATENT DOCUMENTS

| | | |
|---|---|---|
| 1-166539 | 6/1989 | |
| 61-142744 | 6/1986 | Japan . |
| 61-220432 | 9/1986 | Japan . |
| 9008628 | 1/1989 | Japan . |
| 2-039428 | 2/1990 | Japan . |
| 4-84427 | 3/1992 | Japan . |
| 4-354331 | 8/1992 | Japan . |

OTHER PUBLICATIONS

"The Merck Index", Windholz et al.; 10th ed.; 1983; pp. 1287–1288.
"Determination of the Vapor Pressure and Vaporization Coefficient of Polymeric Sulfur Nitride; (SN)x"; 1977; Inorgonic Chem. 16(12); Weter et al.; abstract only.
"D.C. Plasma Etching of Silicon by Sulphur Hexafluoride Mass Spectrometric Study of Discharge Products"; Wagner et al.; 1981; pp. 201–204.
Takuo Sugano, "Semiconductor Plasma Processing Technique", Sangyo Tosho Kabushiki Kaisha, pp. 133 to 134.
S6-2, Transactions of the Institute of Electrical Engineers of Japan, 1980, pp. S.6-5 to S.6-8.
Suto et al, "Highly Selective Etching of $Si_3N_4$ to $SiO_2$ Employing Fluorine and Chlorine Atoms Generated by Microwave Discharge", Proceedings of Symposium on Dry Process, vol. 88, No. 7, 1987, pp. 86–94.

Primary Examiner—Nam Nguyen
Assistant Examiner—George Goudreau
Attorney, Agent, or Firm—Hill, Steadman & Simpson

[57] ABSTRACT

A dry etching method for etching an $SiO_2$ interlayer insulation film 4 formed on an $Si_2N_4$ underlying film 3 using an $S_2F_2/N_2$ mixed gas. While the etching proceeds by way of F* and $SF_x{}^+$ yielded from $S_2F_2$, atoms yielded similarly from $S_2F_2$ and N atoms yielded from $N_2$ are combined with each other, thus yielding sulfur nitride based compounds such as polythiazyl $(SN)_x$ to be deposited on pattern sidewall surfaces. When the $Si_3N_4$ underlying film 3 is exposed, N atoms in the film and S atoms in a plasma are combined to form $(SN)_x$. These $(SN)_x$ in a gaseous phase and on solid surface protect wafer surfaces, improving selectivity. It is also possible to etch the $SiO_2$ interlayer insulation film with an $Si_3N_4$ mask, achieving high selectivity to the mask.

24 Claims, 5 Drawing Sheets

DRY ETCHING METHOD

BACKGROUND OF THE INVENTION

1. Field of the Invention

This invention relates to a dry etching method adopted for production of semiconductor devices, particularly to a method of etching a silicon oxide layer while securing high selectivity to a silicon nitride based material layer.

2. Description of the Related Art

As semiconductor devices of large-scale integration and high performance have been diffused, as seen in VLSI and ULSI of recent years, a technique of dry etching for an insulation film is largely demanded for achieving high anisotropy, high etchrate, high selectivity, low damage and low pollution without sacrificing any one of these requirements.

For etching an insulation film consisting of silicon oxide ($SiO_x$, where $x=2$ in particular), $CHF_3$, $CF_4/H_2$ mixed, $CF_4/O_2$ mixed, and $C_2F_6/CHF_3$ mixed gases have hitherto been used as etching gases. These gases consist mainly of a fluorocarbon based gas with a ratio of the number of carbon atoms to the number of fluorine atoms in a molecule or C/F ratio of 0.25 or higher. These gas systems are used for the following reasons: (a) C contained in the fluorocarbon based gas forms a C—O bond on an $SiO_2$ layer surface, thereby cutting or weakening the Si—O bond; (b) $CF_n^+$ (particularly $n=3$) as an etchant for the $SiO_2$ layer; and (c) since a relatively carbon-abundant state is created in a plasma, oxygen within $SiO_2$ is removed in the form of CO or $CO_2$ while a deposition of a carbonaceous polymer on the surface of a underlying silicon due to a contribution of C, H and F contained in the gas lowers the etchrate, thereby securing high selectivity to the underlying layer.

The above-mentioned additional gases such as $H_2$, $O_2$, etc., which are used for the purpose of controlling selection ratio, can reduce or increase the amount of F* generation. In short, these additional gases exhibit effects of controlling the apparent C/F ratio in the etching reaction system.

Fundamentally, an insulation film consisting of silicon nitride ($Si_xN_y$, where $x=3$, $y=4$ in particular) also is etched with the same gas system as in the case of etching the $SiO_2$ layer. However, while the $SiO_2$ layer is etched by a mechanism primarily of ion-assisted reaction, the $Si_xN_y$ layer is etched on the basis of a radical reaction mechanism using F* as the main etchant, with higher etchrate than in the case of the $SiO_2$ layer. This can be more or less predicted from the following relation in the amount of inter-atomic bond energies: Si—F bond (132 kcal/mole) > Si—O bond (111 kcal/mole) > Si—N bond (105 kcal/mole). Different values of inter-atomic bond energies may be given, depending on calculation methods. However, data described in R. C. Weast ed., "Handbook of Chemistry and Physics," 69th ed., 1988, CRC Press, Florida, USA, are referred to here.

Meanwhile, as the device structure has become complex recently, it has become necessary to carry out etching highly selective between the $SiO_x$ layer and the $Si_xN_y$ layer.

For example, etching of the $Si_xN_y$ layer on the $SiO_x$ layer is carried out with patterning for prescribing an element isolation region in the LOCOS method. In the present state of art wherein a pad oxide film ($SiO_2$ layer) is thinned for minimizing the bird's beak length, the above-mentioned etching is a process requiring extremely high selectivity to the underlying layer.

On the other hand, etching of the $SiO_x$ layer on an $SiN_x$ is required in, for example, a contact hole processing. There are some cases in recent years in which a thin $Si_xN_y$ layer is provided under an $SiO_x$ interlayer insulation film for the purpose of reducing damages to a wafer at the time of overetching. In these cases, also, high selectivity to the underlying layer is demanded for attaining the purpose.

However, in the case of using an $SiO_x$ layer and an $Si_xN_y$ layer, values of inter-atomic bond energies of an Si—O bond and an Si—N bond are close to each other, and a common etching gas is used. Therefore, highly selective etching is essentially difficult. Techniques for enabling the highly selective etching have hitherto been developed in various places.

There are some reports on the techniques for etching the $Si_xN_y$ layer on the $SiO_x$ layer.

For instance, the present inventor previously disclosed a technique using an etching gas consisting of $CH_2F_2$ gas of a lower C/F ratio (ratio of the number of C atoms to the number of F atoms in one molecule) mixed with $CO_2$ in a mole ratio of 30 to 70%, in the Japanese Patent KOKAI publication Serial No. 61-142744. The gas with a small C/F ratio can form $CF_x^+$ (particularly $x=3$) as an etchant for the $SiO_x$ layer only by rebonding of F*. However, if a great amount of CO* is supplied to this gas system so as to capture F* for removal in the form of COF, the amount of $CF_x^+$ generation is reduced, thus lowering the etchrate for etching the $SiO_2$ layer. On the other hand, $Si_xN_y$ is etched by ions and radicals other than $CF_x^+$, the addition of a large amount of $CO_2$ does not change the etchrate. In this manner, selectivity between both layers can be achieved.

Also, a technique for etching an $Si_xN_y$ layer on an $SiO_x$ layer, by supplying $NF_3$ and $Cl_2$ to a chemical dry etcher and by utilizing FCl formed in a gaseous phase by microwave discharges, is reported in Proceedings of Symposium on Dry Process, vol. 88, No. 7, 1987, pp. 86 to 94. While the Si—O bond contains ion bond by 55%, the Si—N bond contains ion bond by 30%, having higher covalent bond. In short, characteristics of chemical bond in the $Si_xN_y$ layer are close to those of chemical bond (covalent bond) in single-crystal silicon, and thus the $Si_xN_y$ layer is etched by radicals, such as F* and Cl* dissociated from FCl. On the other hand, the $SiO_x$ layer is hardly etched by these radicals, thus enabling highly selective etching.

In this manner, there have been several reports on the techniques for selective etching of the $Si_xN_y$ layer on the $SiO_x$ layer. These techniques are a matter of course in a sense, if the etchrates for the two layers are taken into account. That is, if the $SiO_x$ layer is exposed in the middle of the process of etching the $Si_xN_y$ layer by the mechanism primarily of radical reactions, the etchrate is necessarily lowered.

However, these conventional techniques have drawbacks. For instance, in the above-mentioned process using FCl, the use of radical reactions renders it essentially difficult to carry out anisotropic processing.

On the contrary, there has been no report on the technique for selective etching of an $SiO_x$ layer on an $Si_xN_y$ layer. In this case, even when the $SiO_x$ layer is etched by the mechanism primarily of ion-assisted reactions, radicals are necessarily formed in the reaction system, raising the etchrate at the time exposition of $Si_xN_y$. Thus, it is much more difficult to secure selectivity. However, this selective etching is a process to be demanded in the future, and the realization thereof is desired.

OBJECT AND SUMMARY OF THE INVENTION

In view of the above-mentioned status of the art, it is an object of the present invention to provide an etching method for etching an $SiO_x$ layer while securing high selectivity to an $Si_xN_y$ layer.

According to the present invention, there is provided a dry etching method comprising etching selectively a silicon oxide based material layer formed on a silicon nitride based material layer, by using an etching gas containing at least one compound selected from the group consisting of $S_2F_2$, $SF_2$, $SF_4$ and $S_2F_{10}$, and a nitride based compound, while depositing at least a sulfur nitride based compound in a part on a wafer surface.

According to the present invention, there is also provided the dry etching method wherein the etching process is divided into a just etching process for etching the silicon oxide material layer substantially to layer thickness thereof and an overetching process for etching a remaining portion, the just etching process including etching by using an etching gas consisting mainly of the sulfur fluoride while depositing sulfur in a part on the wafer surface, and the overetching process including etching by using the etching gas with a nitrogen based compound added thereto while depositing at least a sulfur nitride based compound.

According to the present invention, there is also provided the etching method wherein a silicon oxide based material layer is etched with a silicon nitride based material layer patterned in advance in a predetermined shape as a mask, by using an etching gas containing the sulfur fluoride and the nitrogen based compound while depositing at least a sulfur nitride based compound in a part on the wafer surface.

According to the present invention, there is further provided the dry etching method wherein the etching process is divided into a just etching process and an overetching process, the just etching process including etching by using an etching gas containing the sulfur fluoride while depositing sulfur and a sulfur nitride based compound in a part on the wafer surface, and the overetching process including etching by using the etching gas with a nitrogen based compound added thereto while depositing at least a sulfur nitride based compound.

The present invention first proposes a technique for carrying out selective etching of an $SiO_x$ layer on an $Si_xN_y$ layer.

The four types of sulfur fluoride used in the present invention, that is, $S_2F_2$, $SF_2$, $SF_4$ and $S_2F_{10}$, are previously proposed by the present inventor as etching gases for etching a silicon oxide based material layer in the Japanese Patent KOKAI Publication Serial No. 4-84427. These four types of sulfur fluoride provide highly effective prevention measures for CFCs. The sulfur fluoride can form $SF_x^+$ in a plasma when dissociated by electric discharge the $SF_x^+$ contributing as a main etchant for the $SiO_x$ layer. Si in the $SiO_x$ layer is removed in the form of $SiF_x$.

The important characteristics of the sulfur fluorides are their capability of releasing sulfur (S) on dissociation due to electric discharge. The following is a summary of various kinds of behavior of S adsorbed on a wafer with its temperature controlled to or under approximately 90° C., which are described in detail in the above-mentioned publication. That is, on sidewalls of a pattern among wafer surfaces, where vertical ion incidence does not take place in principle, S is deposited, exhibiting sidewall protection effects. On the surfaces of a resist mask, an Si substrate and a metallization material, where a large amount of O atoms are not sputtered out, even if these surfaces are vertical ion incidence surfaces, an S deposition process competes with a sputtering removal process, thus improving selectivity to these material layers. On the contrary, on the surface of the $SiO_x$ layer as a layer to be etched, O atoms are sputtered out, so as to remove S in the form of $SO_x$, thus never disturbing the etching process.

In the present invention, the etching gas containing sulfur fluoride further contains a nitrogen based compound. A part of S atoms yielded from sulfur fluoride are combined with N atoms yielded on dissociation of a nitrogen based compound, so as to form various types of sulfur nitride based compounds, thus exhibiting much stronger sidewall protection effects.

There are various kinds of compounds known as the nitrogen based compounds, and utilization thereof is previously proposed by the present inventor for the first time in the specification of the Japanese Patent Application No. 3-155454.

In the present invention, a typical sulfur nitride based compound particularly expected to have sidewall protection effects is polythiazyl $(SN)_x$. This polymer, when in a crystalline state, has a structure in which covalent bond chains having a repetitive structure of S-N-S-N... are arranged in parallel to each other, and exhibits higher durability against attacks of the etchant than a single S.

At this time, since there are F* in a plasma, thiazyl fluoride formed by $(SN)_x$ combined with fluorine can be yielded. In the case of adding a hydrogen based gas for controlling the mount of F* generation, hydrogen thiazyl may be yielded.

Further, a cyclic sulfur nitride compound with the number of S atoms and the number of N atoms in a molecule being disproportionate, or an imide-type compound consisting of the cyclic sulfur nitride compound with an H atom combined with an N atom thereof may be yielded, depending on conditions.

These sulfur nitride based compounds can be deposited on the surface of a wafer, as long as the temperature of the wafer is maintained to about 130° C. or lower, though depending on other conditions. However, as in the case of S, the sulfur nitride based compounds cannot be deposited on a surface of a material which sputters out a large amount of O atoms, and thus are removed in the form of $SO_x$, $NO_x$, etc.

Meanwhile, in an etching system as described above, all S dissociated from sulfur fluoride are not necessarily changed into sulfur nitride based compounds. Accordingly, it is to be noted that when the sulfur nitride based compound is referred to in the present specification, S is always yielded or intermingled along with the sulfur nitride based compound.

In this manner, etching is carried out while performing surface protection and sidewall protection due the sulfur nitride based compound. Another important point of the present invention is in a mechanism whereby high selectivity is realized for the underlying $Si_xN_y$ layer in case the surface of the underlying $Si_xN_y$ layer is exposed.

If the underlying $Si_xN_y$ layer is exposed, F* extracts Si atoms from the surface of the layer, thus forming dangling bonds of N. The presence of dangling bonds is as already discussed in Takuo Sugano, "Semiconductor Plasma Processing Technique," Sangyo Tosho Kabushiki Kaisha, pp. 133 to 134, and in the Transactions of the Institute of Electrical Engineers of Japan, 1980, S6-2. In the present invention, the dangling bonds are combined with S yielded in a plasma, thus forming various kinds of sulfur nitride based compounds. Then, S and sulfur nitride based compound deposited from the plasma are added to the above sulfur nitride based compounds, thus exhibiting strong surface protection effects, and improving selectivity.

Meanwhile, the deposited S and sulfur nitride based compounds can be removed in the form of $N_2$, $NO_x$, $SO_x$, etc., in carrying out $O_2$ plasma ashing on the resist mask after the etching. Therefore, the S and sulfur nitride based compounds neither remain on the wafer nor generate particle pollution. In a process not using a resist mask such as etchback, S and sulfur nitride based compounds can be removed by dissociation if the wafer is heated approximately to 130° C. or higher.

Also, in the present invention, the etching process is divided into two stages, that is, the just etching process and the overetching process, thus achieving both high etchrate and high selectivity.

That is, nitrogen based compounds are added to the etching gas only in the overetching process requiring particularly high selectivity to the underlying layer. In the just etching process, an etching gas consisting mainly of sulfur fluoride is used, and mainly S is used for deposits. According to this method, the amount of deposits in the just etching process can be reduced, thereby attaining high etchrate.

As another technique of the present invention, an etching method whereby selectivity to a mask is raised in etching an $SiO_x$ layer with an $Si_xN_y$ layer as the mask is proposed.

The principle whereby high selectivity is attained in this method is the same as in the case of etching the $SiO_x$ layer with the $Si_xN_y$ layer as the underlying layer. In this case, since the surface of the $Si_xN_y$ layer which is already a mask at the time of etching is exposed to a plasma, extraction of Si atoms due to F* and S bonding take place shortly after the start of etching. Thus, the surface of this layer is covered with sulfur nitride based compounds such as $(SN)_x$. Further, sulfur nitride based compounds yielded in the plasma are deposited on the $Si_xN_y$ layer. Thus, the former and latter sulfur nitride based compounds cooperatively and strongly protect the surface of the layer. Normally, the etching of the $SiO_x$ layer is carried out with high ionicity, and thereby tends to generate dimensional losses due to retreat of the mask. However, with the above-mentioned method, selectivity to the mask becomes extremely high because of surface protection, leaving no fear of dimensional losses.

Meanwhile, the sidewall protection mechanism and the mechanism whereby the etching proceeds on the exposed surface of the $SiO_x$ layer are as described before.

Further, with the present technique, since a resist mask is not used at the time of etching the $SiO_x$ layer, there is no fear that carbonaceous decomposition products due to resist materials may be generated, and an advantage of reducing particle pollution can be obtained.

Further, in the present invention, the method in which the etching process is divided into two stages, that is, the just etching process and the overetching process, with a nitrogen based compound added to the etching gas only in the overetching process is proposed. With this method, it is possible to relatively reduce the amount of deposits in the just etching process, thus increasing the etchrate. In the overetching process, since sulfur nitride based compounds are deposited, high selectivity can be secured even when a material very easy to be etched by F* like an Si based material layer is used as the underlying layer of the $SiO_x$ based material layer.

BRIEF DESCRIPTION OF THE DRAWINGS

FIG. 1A shows a state in which a resist mask is formed on an $SiO_2$ interlayer insulation film stacked on an $Si_3N_4$ underlying film. FIG. 1B shows a state in which the $SiO_2$ interlayer insulation film is etched. FIG. 1C shows a state in which the resist mask, S, and sulfur nitride compounds are removed by ashing. FIG. 1D shows a state in which the $Si_3N_4$ underlying film exposed on the bottom of the contact hole is selectively removed.

FIG. 2A shows a state in which an $SiO_2$ layer is formed on an entire surface of a wafer. FIG. 2B shows a state in which the etchback of the $SiO_2$ layer and selective etching of a second $SiO_2$ gate insulation film are finished. FIG. 2C shows a state in which deposited S and sulfur nitride based compounds are removed by decomposition or sublimation due to heating.

FIG. 4A shows a state of a wafer before etching with an $Si_3N_4$ mask being formed on an $SiO_2$ interlayer insulation film. FIG. 4B shows a state in which the etching of the $SiO_2$ interlayer insulation film is finished. FIG. 4C shows a state in which deposited S and sulfur nitride based compounds are removed by decomposition or sublimation due to heating.

FIG. 5A shows a state in which just etching is finished. FIG. 5B shows a state in which overetching is finished.

DESCRIPTION OF THE PREFERRED EMBODIMENTS

Figure 1A:
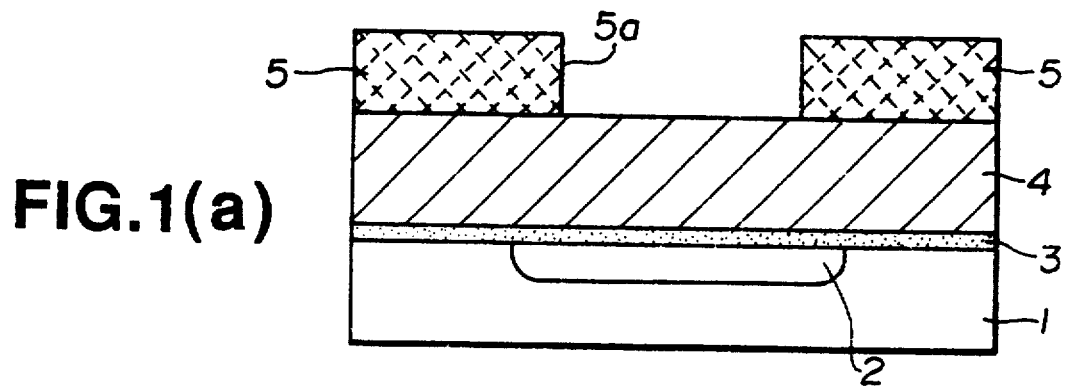
FIGS. 1A to 1D are schematic cross-sectional views showing processes in which the present invention is applied to contact hole processing, in order of the processes.

Referring to the drawings, preferred embodiments of the present invention are explained in detail.

EXAMPLE 1

In the present example, the present invention is applied to contact hole processing in which an $SiO_2$ interlayer insulation film is etched using an $S_2F_2/N_2/H_2$ mixed gas. This process is explained with reference to FIGS. 1A to 1D. FIGS. 1A to 1D are described with compressed aspect ratios compared with actual aspect ratios, as a matter of convenience for schematic expressions.

First, an $Si_3N_4$ underlying film 3 with a thickness of 500 nm was formed by, for instance, the pressure-reduced CVD method on a silicon substrate i on which an impurity diffused region 2 had been formed in advance. Then, an $SiO_2$ interlayer insulation film 4 with a thickness of 500 nm was formed by the normal CVD method, as shown in FIG. 1A. Further, SAL-801 (trade name; Shipley Co., Inc. product) which is a chemical amplification negative 3-component photoresist was applied on the $SiO_2$ interlayer insulation film 4, and a resist mask 5 having an aperture 5a was formed by excimer laser lithography and an alkaline phenomenon.

A wafer thus formed was set on a wafer setting electrode of a magnetron RIE (reactive ion etching) device, and an ethanol based coolant was supplied from a cooling system such as a chiller to a cooling pipe built within the wafer setting electrode for circulation. In this state, the $SiO_2$ interlayer insulation film 4 was etched, for example, under the following conditions:

| | |
|---|---|
| $S_2F_2$ flow rate | 50 SCCM |
| $N_2$ flow rate | 20 SCCM |
| $H_2$ flow rate | 20 SCCM |
| gas pressure | 1.3 Pa (= 10 mTorr) |
| RF power density | 7.9 $W/cm^2$ (2 MHz) |
| wafer temperature | $-50°$ C. |

Figure 1B:
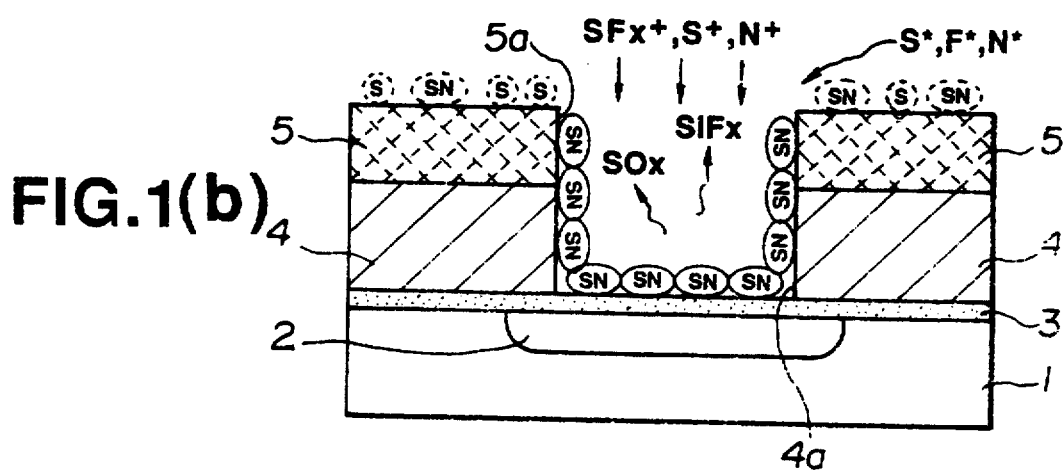
Figure 1C:
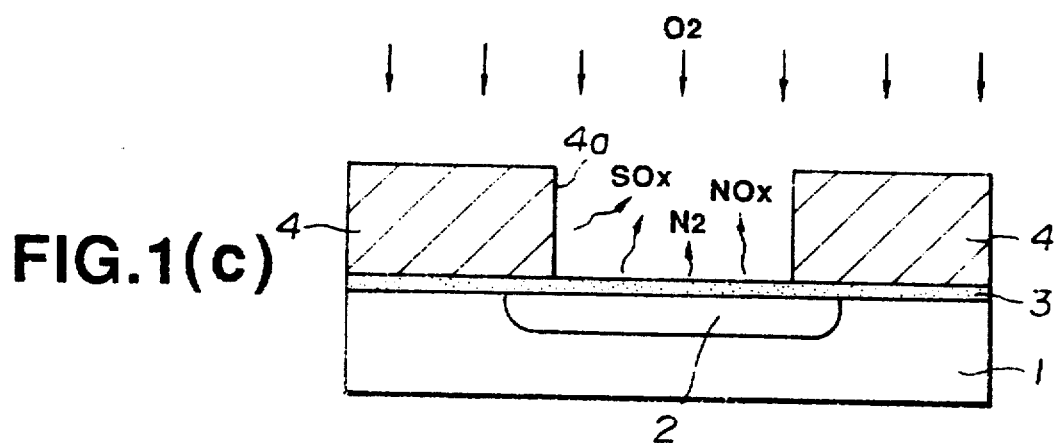
Figure 1D:
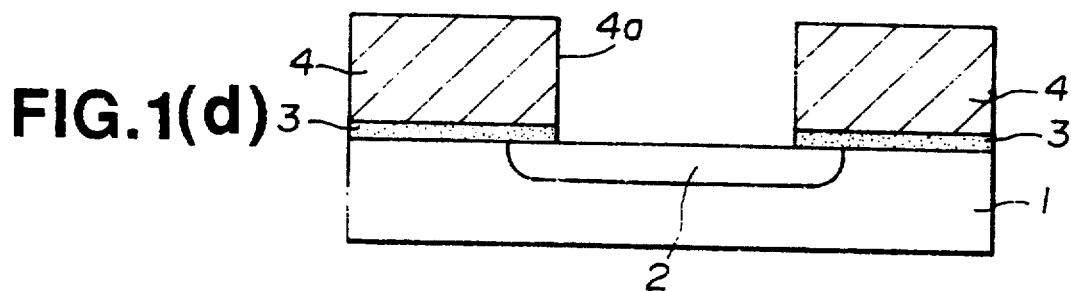

The mechanism whereby this etching proceeds is schematically shown in FIG. 1B. In FIG. 1B, composition formulas of chemical species for which deposition and sputtering compete with each other are surrounded by dotted lines, and composition formulas of chemical species which are stably deposited are surrounded by real or solid lines. Sulfur nitride based compounds are represented by "SN", and polythiazyl $(SN)_x$ is schematically expressed by "SN" connected in a chain state.

The etching of the $SiO_2$ interlayer insulation film 4 proceeded by a mechanism in which a radical reaction due to $S^*$, $F^*$, etc. yielded in a plasma is assisted by incident energy of ions such as $SF_x^+$, $S^+$ and $N^+$. Also, free S yielded in the plasma on dissociation of $S_2F_2$ due to electric discharge, and sulfur nitride based compounds SN yielded by reactions of part of the free S with N atoms released from $N_2$, were adsorbed on the surface of the cooled wafer.

The S adsorbed on the vertical ion incidence face of the $SiO_2$ interlayer insulation film 4 was combined with O atoms sputtered out from this face and was removed in the form of $SO_x$, thus not lowering the etchrate for the $SiO_2$ interlayer insulation film 4 at all. However, on the surface of the resist mask 5, S deposition and sputtering removal competed with each other, reducing the etchrate. Thus, selectivity to the resist was improved.

On the other hand, on pattern sidewall sections where no vertical ion incidence takes place in principle, sulfur nitride based compounds mainly of $(SN)_x$ were deposited, exhibiting sidewall protection effects. As a result, a contact hole 4a having vertical sidewalls was formed.

Meanwhile, $H_2$ is added in order to increase an apparent S/F ratio in the etching system for avoiding a reduction of election ratio due to $F^*$. $H^*$ dissociated from $H_2$ can capture part of $F^*$ and can be eliminated in the form of HF from the etching system. Such control of the S/F ratio is highly effective for preventing anisotropy and selectivity to the underlying layer from being reduced at the time of overetching, that is, when there are relatively excessive $F^*$.

Further, when the $Si_3N_4$ underlying film 3 was exposed on the bottom of the contact hole 4a with the etching of the $SiO_2$ interlayer insulation film 4 being substantially finished, N atoms supplied from the $Si_3N_4$ underlying film 3 were combined with S atoms in the plasma, so as to form sulfur nitride based compounds, covering the exposed face of the film. Further, the sulfur nitride based compounds yielded in the plasma caused competition of deposition and sputtering removal in this portion. Thus, the etchrate was significantly lowered, and a high selection ratio of about 50 to the $Si_3N_4$ underlying film 3 was attained.

Next, the wafer is removed to a plasma asher, and the resist mask 5 was removed by $O_2$ plasma. At this time, S deposited on the pattern sidewalls was removed in the form of $SO_x$ by a combustion reaction, and $(SN)_x$ deposited on the surface of the $Si_3N_4$ underlying film 3 was removed in the form of $N_2$, $NO_x$ and $SO_x$ by combustion or decomposition.

Finally, the wafer was soaked in a hot phosphate solution, and the $Si_3N_4$ underlying film 3 exposed on the bottom of the contact hole 4a was removed by decomposition.

With the above-described processes, the contact hole 4a of a highly anisotropic shape was formed without causing damages to the impurity diffused region 2 or generating particle pollution.

EXAMPLE 2

In the present example, etchback for forming sidewalls consisting of an $SiO_2$ layer on both sidewall sections of a gate electrode formed on a gate insulation film containing an $Si_3N_4$ layer is carried out using an $S_2F_2/N_2$ mixed gas. This process is included in a manufacture process of a MOS-FET having an LDD structure. The process is explained hereinafter, with reference to FIGS. 2A to 2C.

Figure 2A:
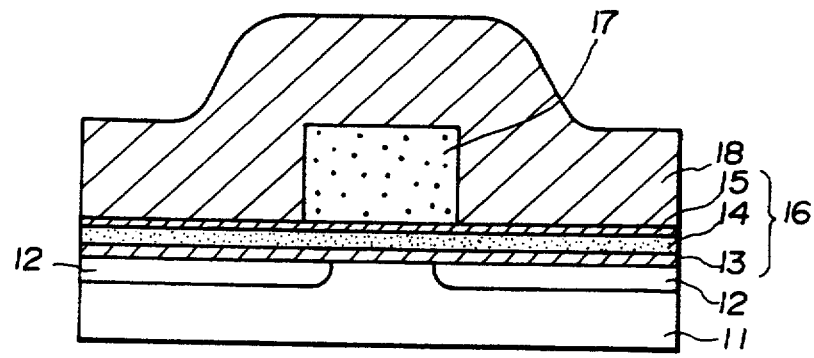
FIGS. 2A to 2C are schematic cross-sectional views showing processes in which the present invention is applied to etchback for forming sidewalls on both sidewall sections of a gate electrode on a gate insulation film having a so-called ONO structure, in order of the processes.
Figure 2B:
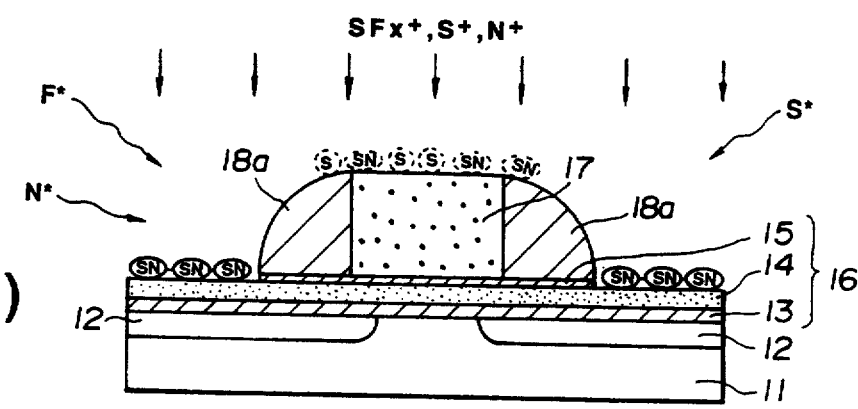

First, a gate insulation film 16 having a so-called ONO (oxide film/nitride film/oxide film) structure was formed on a silicon substrate 11, and a gate electrode 17 consisting of an n+-type polysilicon layer was formed by patterning, as shown in FIG. 2A. A low concentration impurity diffused region 12 was formed by carrying out ion implantation with the gate electrode 17 as a mask, and then, an $SiO_2$ layer 18 was deposited on the entire surface of a wafer by the CVD method. The gate insulation film 16 includes a first $SiO_2$ gate insulation film 13 with a thickness of 4 nm, an $Si_3N_4$ gate insulation film 14 with a thickness of 6 nm and a second $SiO_2$ gate insulation film stacked in order from the silicon substrate 11.

The wafer was set on an RF-biased magnetically-enhanced microwave plasma etcher, and the etch back of the $SiO_2$ layer and etching of the second $SiO_2$ insulation film 15 were carried out, for example, under the following conditions:

| | |
|---|---|
| S$_2$F$_2$ flow rate | 50 SCCM |
| N$_2$ flow rate | 50 SCCM |
| gas pressure | 1.3 Pa (= 10 mTorr) |
| microwave power | 850 W (2.45 GHz) |
| RF bias power | 200 W (400 kHz) |
| wafer temperature | −30° C. |

The mechanism whereby this etching proceeds is as explained in example 1. The etching was finished at the time when the gate electrode 17 and the surface of the Si$_3$N$_4$ gate insulation film 14 were exposed, and sidewalls 18a were formed on both sidewall sections of the gate electrode 17. Unlike the case of the SiO$_2$ layer 18, O atoms were not supplied on the surface of the gate electrode 17. Therefore, deposition of S and sulfur nitride based compounds SN competed with sputtering removal thereof, thus obtaining a high selection ratio with a significantly lowered etchrate. Also, on the surface of the Si$_3$N$_4$ gate insulation film 14, deposition of sulfur nitride based compounds greatly lowered the etchrate, thus obtaining a high selection ratio of about 50.

Figure 2C:
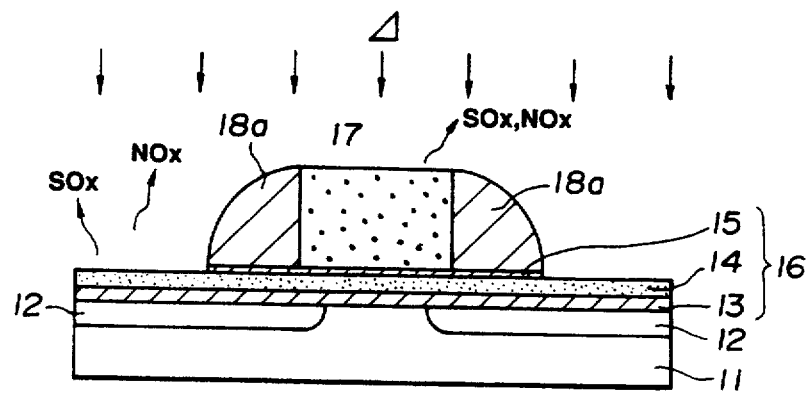

In the above process, since a resist mask was not used, O$_2$ plasma ashing was not carried out after the etching, and thus, another process was necessary for removing the S and sulfur nitride based compounds deposited on the surface of the wafer. These S and sulfur nitride based compounds was removed simply by heating the wafer to about 130° C. or higher after the etching, without carrying out the plasma processing. At the time when the wafer was heated to about 90° C., S was removed by sublimation. As the temperature of the wafer was raised further, the sulfur nitride based compounds were removed by decomposition. As a result, the sidewalls 18a were formed, without causing damages to the underlying low concentration impurity diffused region 12 and generating particle pollution, as shown in FIG. 2C.

EXAMPLE 3

In the present example, the etch back process for forming the sidewalls described in example 2 is divided into two stages, that is, a just etching process using an S$_2$F$_2$ gas and an overetching process using an S$_2$F$_2$/N$_2$ mixed gas.

First, a wafer as shown in FIG. 2A was set on a magnetically-enhanced microwave plasma etcher, and the just etching was carried out, for example, under the following conditions:

| | |
|---|---|
| S$_2$F$_2$ flow rate | 50 SCCM |
| gas pressure | 1.3 Pa (= 10 mTorr) |
| RF bias power | 200 W (400 kHz) |
| microwave power | 850 W (2.45 GHz) |
| wafer temperature | −80° C. |

Figure 3:
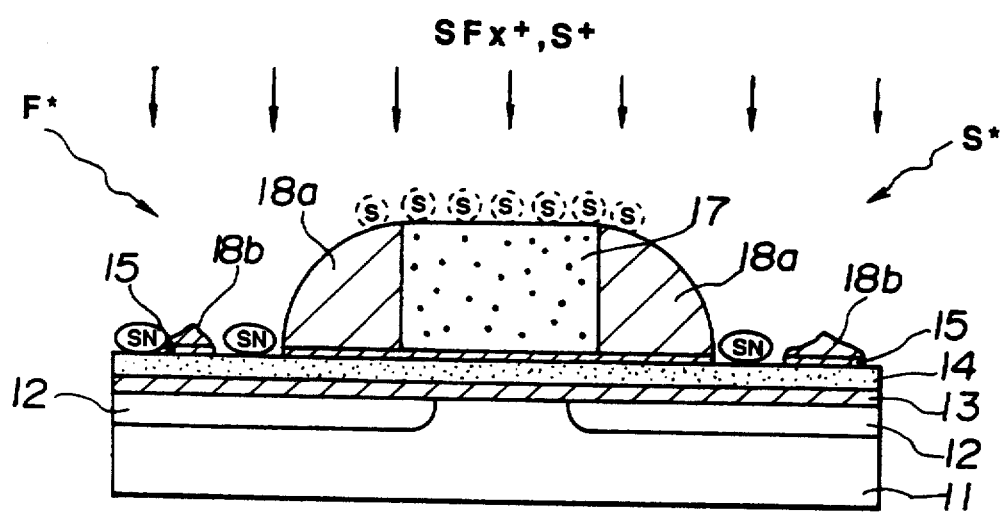
FIG. 3 is a schematic cross-sectional view showing a state in which just etching is finished in another example of processes for application of the present invention to an etch back for forming sidewalls.

In this just etching process, an etching gas of single composition of S$_2$F$_2$ was used. Accordingly, deposits protecting the exposed surface of the gate electrode 17 in this process are S only, as shown in FIG. 3. Thus, in order to prevent the surface of the gate electrode 17 from being corroded by F* at the time then the gate electrode 17 was exposed, the temperature of the wafer was made lower than in example 2, for controlling radical reactivity. However, since the etchback of the SiO$_2$ layer itself proceeded in the ion mode, the etchback rate was not affected by the low temperature but was rather raised by the reduction of the deposits.

As part of the Si$_x$N$_y$ gate insulation film was exposed, sulfur nitride based compounds were yielded on the exposed surface.

At the end of the just etching, etching residues 18b were left on the SiO$_2$ interlayer insulation film 18.

Thus, in order to remove the etching residues 18b (more precisely, the second SiO$_2$ gate insulation film 15 being included), the overetching was carried out, for example, under the following altered etching conditions:

| | |
|---|---|
| S$_2$F$_2$ flow rate | 50 SCCM |
| N$_2$ flow rate | 50 SCCM |
| gas pressure | 1.3 Pa (= 10 mTorr) |
| RF bias power | 200 W (400 kHz) |
| microwave power | 850 W (2.45 GHz) |
| wafer temperature | −30° C. |

In this overetching process, by contribution of sulfur nitride based compounds formed on the surface of the Si$_3$N$_4$ gate insulation film 14 and sulfur nitride based compounds deposited from a gaseous phase, the residues 18b were removed without causing damages to the underlying layer, and the sidewalls 18a were formed. It is a matter of course that the exposed surface of the gate electrode 17 was protected by the sulfur nitride based compounds deposited from the gaseous phase.

In the present example, composition of the etching gas was altered between the just etching process and the overetching process, thereby attaining both high etchrate and high selectivity.

EXAMPLE 4

In the present example, the present invention is applied to contact hole processing in which an SiO$_2$ interlayer insulation film is etched using an S$_2$F$_2$/N$_2$/H$_2$ mixed gas and an Si$_3$N$_4$ mask. This process is explained with reference to FIG. 4.

Figure 4A:
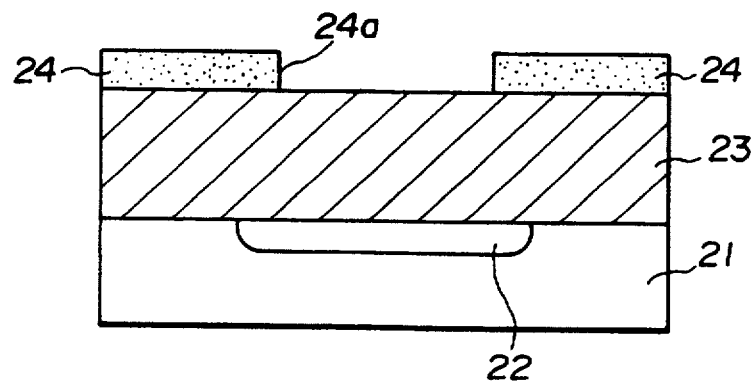
FIGS. 4A to 4C are schematic cross-sectional views showing another example of processes in which the present invention is applied to contact hole processing, in order of the processes.
Figure 4B:
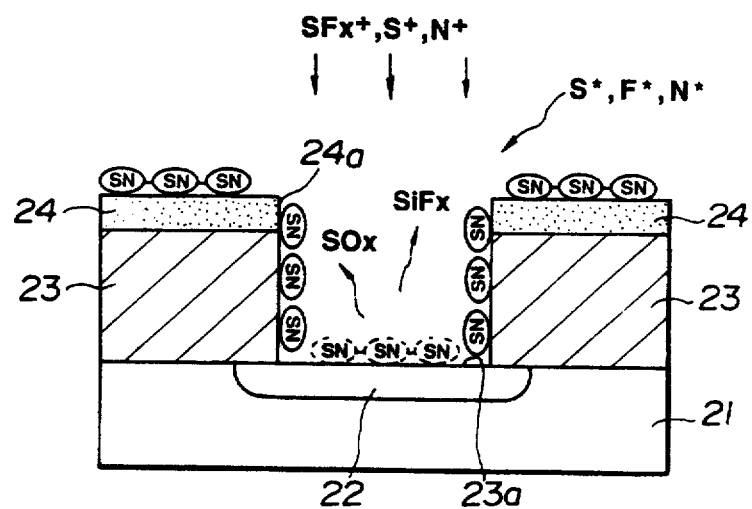

First, a wafer was prepared in the following. That is, an SiO$_2$ interlayer insulation film 23 with a thickness of 1 μm was formed by, for example, the normal-pressure CVD method on a silicon substrate on which an impurity diffused region 22 had been formed in advance. Further, an Si$_3$N$_4$ mask 24 patterned in a predetermined shape was formed on the SiO$_2$ interlayer insulation film 23, as shown in FIG. 4A. The Si$_3$N$_4$ mask 24 was formed by etching an Si$_3$N$_4$ layer with a thickness of 100 nm formed by, for example, the pressure-reduced CVD method, using as a mask a chemical amplification photoresist pattern formed by excimer laser lithography and development. The Si$_3$N$_4$ mask 24 had an aperture 24a. The photoresist mask was removed by ashing.

The wafer was set on an RF-biased magnetically-enhanced microwave plasma etcher, and the SiO$_2$ interlayer insulation film 23 was etched, for example, under the following conditions:

| | |
|---|---|
| S$_2$F$_2$ flow rate | 50 SCCM |
| N$_2$ flow rate | 20 SCCM |
| H$_2$ flow rate | 20 SCCM |
| gas pressure | 1.3 Pa (= 10 mTorr) |
| RF bias power | 200 W (400 kHz) |
| microwave power | 850 W (2.45 GHz) |
| wafer temperature | −30° C. |

In the present example, since the $Si_3N_4$ mask 24 was already exposed on the surface of the wafer before the start of the etching, the surface thereof was covered with sulfur nitride based compounds such as $(SN)_x$ shortly after starting the etching. The sulfur nitride based compounds greatly lowered the etchrate on the surface of the $Si_3N_4$ mask 24, thus avoiding generation of dimensional losses due to retreat of the mask and deterioration of the cross-sectional shape of a contact hole 23a. The selection ratio to the $Si_3N_4$ mask was about 50.

On the other hand, the etching of the $SiO_2$ interlayer insulation film 23 proceeded anisotropically with sidewall sections of the $SiO_2$ interlayer insulation film 23 being protected by sulfur nitride based compounds. As the underlying impurity diffused region 22 was exposed, deposition and sputtering removal of the sulfur nitride based compounds competed on the surface of the impurity diffused region 22, thus realizing high selectivity to the underlying layer.

Figure 4C:
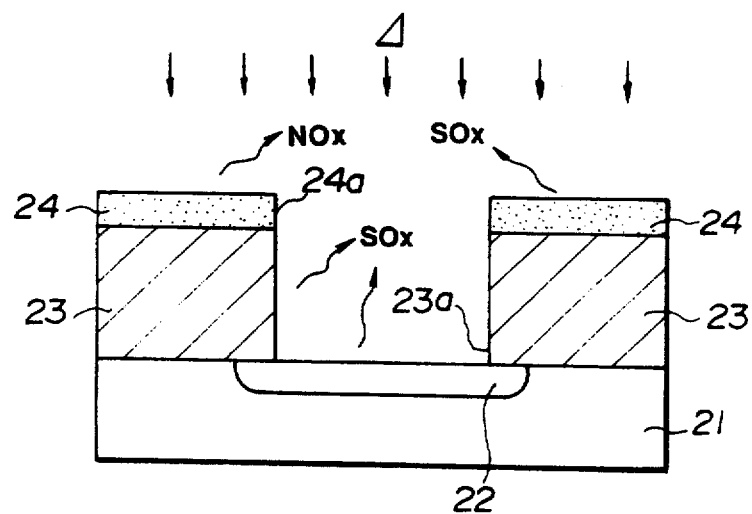
Figure 5A:
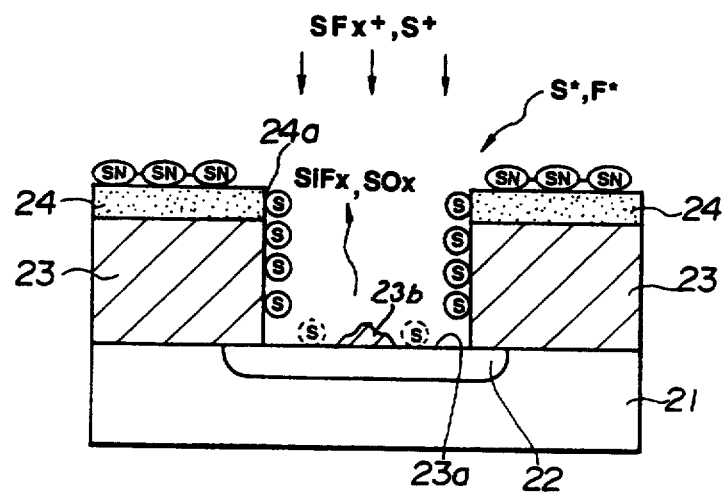
FIGS. 5A and 5B are schematic cross-sectional views partially showing still another example of processes in which the present invention is applied to contact hole processing, in order of the processes.
Figure 5B:
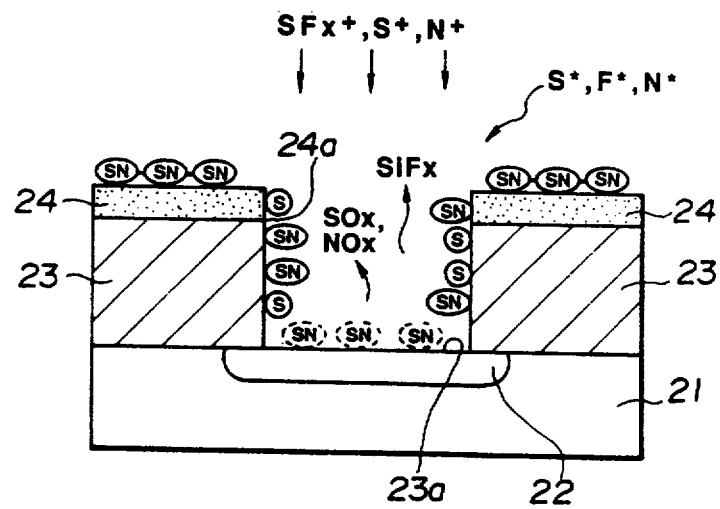

After the etching, the sulfur nitride based compounds were removed by heating the wafer to about 130° C. or higher, as shown in FIG. 4C.

In general, large ion incidence energy is employed for etching an $SiO_2$ layer. Therefore, a process using a resist mask has drawbacks such as retreat of the mask due to incident ion sputtering and accompanying generation of particle pollution. However, according to the process of the present example, since the etching of the $SiO_2$ layer with the $Si_3N_4$ layer as a mask can be carried out, the resist mask is not necessary, and the above-mentioned problems can be avoided. In this case, the $Si_3N_4$ layer used as the mask need not be removed but can be used as part of the insulation film.

EXAMPLE 5

In the present example, the contact hole processing in example 4 is divided into two stages, that is, a just etching process using an $S_2F_2/H_2$ mixed gas and an overetching process using an $S_2F_2/N_2$ mixed gas.

First, a wafer as shown in FIG. 4A was set on a magnetically-enhanced microwave plasma etcher, and the just etching was carried out, for example, under the following conditions:

| | |
|---|---|
| $S_2F_2$ flow rate | 50 SCCM |
| $H_2$ flow rate | 20 SCCM |
| gas pressure | 1.3 Pa (= 10 mTorr) |
| RF bias power | 200 W (400 kHz) |
| microwave power | 850 W (2.45 GHz) |
| wafer temperature | −30° C. |

In this just etching process, since deposits yielded in a gaseous phase were S only, sidewall protection was performed by S. Surface protection effects of the $Si_xN_y$ mask 24 are as described in example 4. On the exposed surface of the impurity diffused region 22 on the bottom of the contact hole 23a, deposition and sputtering removal of S competed with each other.

At the end of the just etching, a small amount of etching residue 23b of the $SiC_2$ interlayer insulation film 23 was left.

Thus, the overetching for removing the etching residue 23b was carried out, for example, under the following conditions:

| | |
|---|---|
| $S_2F_2$ flow rate | 50 SCCM |
| $N_2$ flow rate | 50 SCCM |
| gas pressure | 1.3 Pa (= 10 mTorr) |
| RF bias power | 50 W (400 kHz) |
| microwave power | 850 W (2.45 GHz) |
| wafer temperature | −30° C. |

In this overetching process, a high selection ratio of about 50 to the silicon substrate 21 was secured, because of contribution of the sulfur nitride based compounds yielded from the gaseous phase to surface protection and because of a reduction of ion incidence energy.

The present invention has been described on the basis of the above five examples. However, the present invention is not limited to these examples, and for instance, various kinds of additional gases may be mixed with the etching gas. As additional gases for increasing the S/F ratio in the etching reaction system, $H_2S$ and silane based gases such as $SiH_4$ and $Si_2H_6$ may be used, other than the above-mentioned $H_2$. Further, a rare gas such as He and Ar may be added for the purpose of attaining sputtering effects, cooling effects and dilution effects.

In the above examples, $S_2F_2$ is used as sulfur fluoride. However, even in the case of using sulfur fluoride other than those proposed in the present invention, etching can be carried out with the same mechanism.

As the sulfur based compounds, $NF_3$, $NCl_3$, $NBr_3$, $NO_2$ and $N_2H_2$ may be used, besides the above-mentioned nitrogen. However, $NH_3$ is not preferable since it yields $(NH_4)_2S$, which cannot be removed by ashing or heat sublimation.

Further, it is a matter of course that wafer structure and etching conditions can be suitably changed.

As is clear from the above description, with the dry etching method of the present invention, a process for etching an $SiO_x$ layer while securing high selectivity to an $Si_xN_y$ layer becomes possible, which has hitherto been difficult. The $Si_xN_y$ layer may be an underlying layer or a mask for the $SiO_x$ layer, and there is a high possibility that a new device structure may be developed. It is a matter of course that the present invention provides excellent preventive measures for CFCs.

The present invention, designed on the basis of minute design rules, is suitable for production of semiconductor devices requiring high performance and large-scale integration, thus having significant industrial advantage.

What is claimed is:

1. A dry etching method for selectively etching a silicon oxide based material layer formed on a silicon nitride based material layer, comprising
   carrying out a plasma etching using an etching gas containing at least one kind of sulfur fluoride selected from the group consisting of $S_2F_2$, $SF_2$, $SF_4$ and $S_2F_{10}$, and a nitrogen based gas, and
   while plasma etching depositing a sulfur nitride based compound on a surface portion of the silicon oxide based material.

2. The dry etching method as claimed in claim 1 wherein the nitrogen based gas is selected from the group consisting of $N_2$, $NF_3$, $NCl_3$, $NBr_3$, $NO_2$ and $N_2H_2$.

3. The dry etching method as claimed in claim 1 wherein an H based gas selected from the group consisting of $H_2$, $H_2S$ and a silane based gas is added to the etching gas.

4. The dry etching method as claimed in claim 1 wherein the sulfur nitride based compound is polythiazyl expressed by $(SN)_n$.

5. The dry etching method as claimed in claim 1 wherein deposited sulfur nitride based compound is removed by ashing after the etching.

6. The dry etching method as claimed in claim 1 wherein deposited sulfur nitride based compound is removed by sublimation due to heating after the etching.

7. A dry plasma etching method for selectively etching a silicon oxide based material layer formed on a silicon nitride based material layer, comprising
- a just etching process, using an etching gas containing at least one kind of sulfur fluoride selected from the group consisting of $S_2F_2$, $SF_2$, $SF_4$ and $S_2F_{10}$, and plasma etching a silicon oxide material layer substantially to thickness thereof while yielding depositable sulfur in an etching reaction system, and
- an overetching process, using an etching gas containing at least one kind of sulfur fluoride selected from the group consisting of $S_2F_2$, $SF_2$, $SF_4$ and $S_2F_{10}$, and a nitrogen based compound, and plasma etching a remaining portion of the silicon oxide based material layer while yielding a depositable sulfur nitride based compound in an etching reaction system.

8. The dry etching method as claimed in claim 7 wherein the nitrogen based compound is selected from the group consisting of $N_2$, $NF_3$, $CNl_3$, $NBr_3$, $NO_2$ and $N_2H_2$.

9. The dry etching method as claimed in claim 7 wherein an H based gas selected from the group consisting of $H_2$, $H_2S$ and a silane based gas is added to the etching gas.

10. The dry etching method as claimed in claim 7 wherein the sulfur nitride based compound is polythiazyl expressed by $(SN)_n$.

11. The dry etching method as claimed in claim 7 wherein deposited sulfur nitride based compound is removed by ashing after the etching.

12. The dry etching method as claimed in claim 7 wherein deposited sulfur nitride based compound is removed by sublimation due to heating after the etching.

13. A dry etching method for selectively etching a silicon oxide based material layer formed on a substrate, comprising
- providing a patterned layer of sulfur nitride based compound on the silicon oxide based material layer,
- carrying out a plasma etching using an etching gas containing at least one kind of sulfur fluoride selected from the group consisting of $S_2F_2$, $SF_2$, $SF_4$ and $S_2F_{10}$, and a nitrogen based gas, and while plasma etching depositing a sulfur nitride based compound on exposed portions of the silicon oxide based material layer and the substrate.

14. The dry etching method as claimed in claim 13 wherein the nitrogen based gas compound is selected from the group consisting of $N_2$, $NF_3$, $NCl_3$, $NBr_3$, $NO_2$ and $N_2H_2$.

15. The dry etching method as claimed in claim 13 wherein an H based gas selected from the group consisting of $H_2$, $N_2S$ and a silane based gas is added to the etching gas.

16. The dry etching method as claimed in claim 13 wherein the sulfur nitrogen based compound is polythiazyl expressed by $(SN)_n$.

17. The dry etching method as claimed in claim 13 wherein deposited sulfur nitride based compound is removed by ashing after the etching.

18. The dry etching method as claimed in claim 13 wherein deposited sulfur nitrogen based compound is removed by sublimation due to heating after the etching.

19. A dry plasma etching method for etching a silicon oxide based material layer with a sulfur nitride based compound layer selectively formed thereon as a mask, comprising
- a just etching process, using an etching gas containing at least one kind of sulfur fluoride selected from the group consisting of $S_2F_2$, $SF_2$, $SF_4$ and $S_2F_{10}$, and a nitrogen based compound, and plasma etching the silicon oxide based material layer substantially to thickness thereof while yielding depositable sulfur and sulfur nitride based compound in an etching reaction system, and
- an overetching process, using an etching gas containing at least one kind of sulfur fluoride selected from the group consisting of $S_2F_2$, $SF_2$, $SF_4$ and $S_2F_{10}$, and a nitrogen based compound, and plasma etching a remaining portion of the silicon oxide material layer while yielding a depositable sulfur nitride based compound in an etching reaction system.

20. The dry etching method as claimed in claim 19 wherein the nitrogen based compound is selected from the group consisting of $N_2$, $NF_3$, $NCl_3$, $NBr_3$, $NO_2$ and $N_2H_2$.

21. The dry etching method as claimed in claim 19 wherein an H based gas selected from the group consisting of $H_2$, $H_2S$ and a silane based gas is added to the etching gas.

22. The dry etching method as claimed in claim 19 wherein the sulfur nitride based compound is polythiazyl expressed by $(SN)_n$.

23. The dry etching method as claimed in claim 19 wherein deposited sulfur nitride based compound is removed by ashing after the etching.

24. The dry etching method as claimed in claim 19 wherein deposited sulfur nitride based compound is removed by sublimation due to heating after the etching.

* * * * *